United States Patent [19]
Karpinski

[11] Patent Number: 5,668,825
[45] Date of Patent: *Sep. 16, 1997

[54] LENS SUPPORT STRUCTURE FOR LASER DIODE ARRAYS

[75] Inventor: Arthur A. Karpinski, Jordan, N.Y.

[73] Assignee: Laser Diode Array, Inc., Auburn, N.Y.

[*] Notice: The term of this patent shall not extend beyond the expiration date of Pat. No. 5,526,373.

[21] Appl. No.: 640,124

[22] Filed: Apr. 30, 1996

Related U.S. Application Data

[63] Continuation-in-part of Ser. No. 252,891, Jun. 2, 1994, Pat. No. 5,526,373.
[51] Int. Cl.[6] .................................................. H01S 3/08
[52] U.S. Cl. ........................... 372/101; 372/107; 372/70
[58] Field of Search ............................ 372/101, 98, 107, 372/108, 75; 359/664, 820

[56] References Cited

U.S. PATENT DOCUMENTS

| | | | |
|---|---|---|---|
| 4,731,795 | 3/1988 | Clark et al. | 372/107 |
| 4,762,395 | 8/1988 | Gordon et al. | 359/820 |
| 5,062,117 | 10/1991 | Anthon et al. | 372/75 |
| 5,247,392 | 9/1993 | Piles | 359/664 |
| 5,323,268 | 6/1994 | Kikuchi | 359/664 |

*Primary Examiner*—Leon Scott, Jr.
*Attorney, Agent, or Firm*—Sughrue, Mion, Zinn, Macpeak & Seas

[57] ABSTRACT

A lens support structure for supporting one or a plurality of optical elements, the structure including a base which may be a passive or an active optical element having one or more grooves formed therein. The structure is intended for use with a laser diode array, for collimating or focusing the emission of the laser diode bars in the array. To this end, the grooves in the base are formed precisely, in a predetermined relationship to the pitch of the grooves in the laser diode array, so that when the array and the lens support structure are matched, the light from the bars in the array reaches the optical elements disposed in the grooves in the lens support structure. The grooves may be formed along one axis, or along orthogonal axes. The optical elements in the grooves may be microlenses. Also, the base may have the grooves formed as slots extending completely through the base, support rails being formed unitarily with the base orthogonally to the slots. Alternatively, the base may be formed of a hollow polygonal structure (preferably rectangular), with at least first and second pairs of opposed sides, grooves being formed in at least one of the first and second pairs of opposed sides.

44 Claims, 9 Drawing Sheets

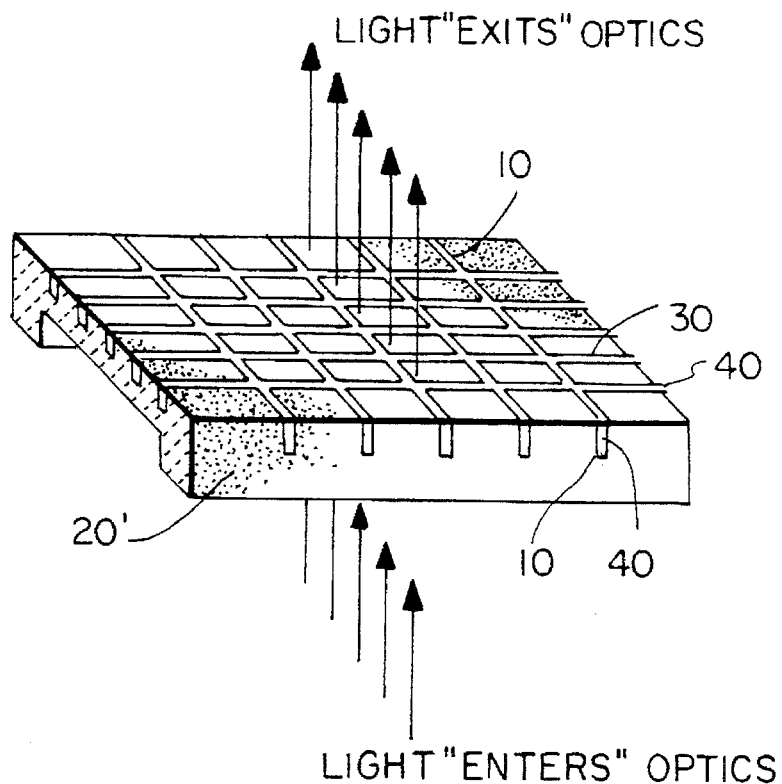
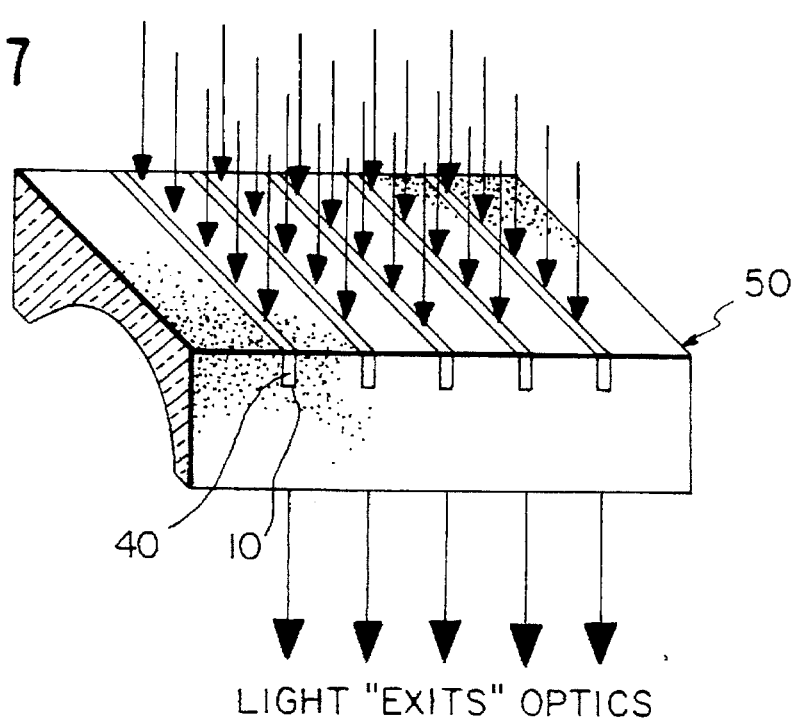

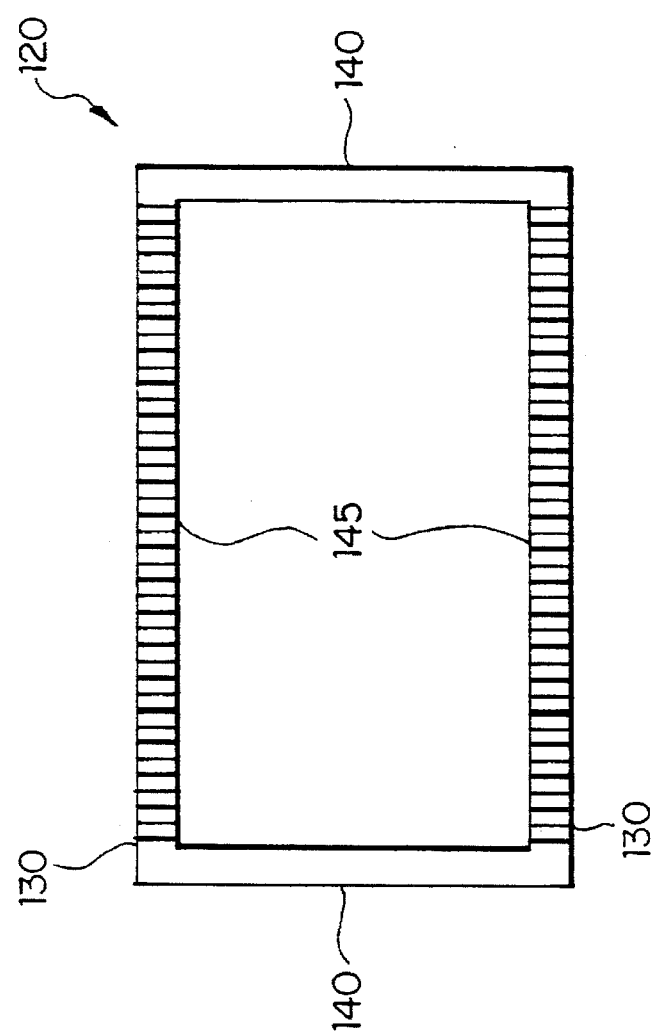
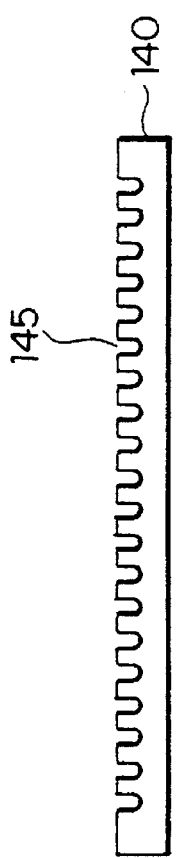

LENS SUPPORT STRUCTURE FOR LASER DIODE ARRAYS

CROSS-REFERENCE TO RELATED APPLICATION

This application is a continuation-in-part of application Ser. No. 08/252,891, filed Jun. 2, 1994 now U.S. Pat. No. 5,526,373.

BACKGROUND OF THE INVENTION

The present invention relates to a one or two dimensional lens support structure for use with laser diode arrays. More particularly, the invention relates to a structure for mounting one or a plurality of lenses on a substrate as a subassembly of working lenses, and to a method of fabrication of such a subassembly. The invention has application in many areas requiring collimation, focusing, or other direction of light emitted by high power semiconductor lasers, including satellite communication directed energy applications, range finding, isotopic separation, pumping of solid state laser systems, and fiberoptic coupling.

Laser diodes are semiconductor structures capable of converting electrical power into optical power with very high efficiency (typically 50%). The present inventor has received patents which disclose and claim laser diode arrays, including U.S. Pat. Nos. 5,040,187, 5,128,951, 5,264,790 and 5,311,535. The disclosures of these patents are incorporated herein by reference.

In recent years, there have been substantial improvements in the quality and availability of GaAs base laser diode material. In addition, it has become possible for a laser device producer to customize the output wavelength of the emission of laser diodes. The ability to grow laser material for emission at wavelengths of 630 nm to 2 microns means that laser diodes have become a preferred device for fabrication of narrow wavelength emission devices. Many of these devices are of relatively low power, such as those used in laser printers and CD devices, which have power levels on the order of a few milliwatts. However, when individual devices are grouped together, with proper heatsinking, tremendous peak and average power levels can be generated. It is not unusual for several thousand emitters to be packaged into just one square centimeter (1 cm$^2$), the package having an optical emission of several thousand watts of peak power and average powers of from 1 to 100 watts per square centimeter. (Powers are expected to climb even higher in the near future.) These higher power laser diode arrays can be used in simple high power flashlamps for night vision systems, or in very high speed, high intensity flashlamps used in very high speed photography.

Two of the major applications for large very high powered laser diode arrays are for pumping of solid state lasers, such as YAG laser systems and fiberoptic bundles. The outputs from the diode pumped solid state lasers are used in many diverse applications, from so-called target designators, to simple cutting operations, to various types of laser based surgery. Direct diode pumping of fiberoptic bundles typically is used for medical devices, and/or where space requirements do not allow for locating actual laser diode arrays at the point at which the emissions are needed. That is, there may be space for a fiberoptic bundle, but not for the diode array module and associated support equipment.

Diode lasers themselves present problems, with respect to emission area and emission characteristics. During the growth and fabrication of the laser diode device itself, the actual device emission area is extremely small (on the order of 200 microns×1 micron). (By comparison, the typical human hair has a diameter of 100 microns.) Light emitted from such a source does not come out of the device in a narrow "beam," such as that normally seen in laser photos and demonstrations, but instead fans out very quickly. Typically, the divergence of this light can be from 60°–90° (typically 60°) in one axis, (known in the industry as the fast axis because of its relatively fast divergence), and 10°–30° (typically 10°) in the other axis, (known in the industry as the slow axis because of its relatively slow divergence). Examples of the divergence of the light in the different axes is shown in FIG. 1, relative to a typical laser diode bar 1.

While the emission's light intensity and tight wavelength still make laser diodes useful, if the light could be collimated, that is, made to travel in a column or a straight line, laser diodes would become still more useful. They also would become more useful if the light could be not only collimated, but also focused, that is, made to travel toward a desired focal point. It also would be useful to limit the "fanning out" of the light by limiting its divergence along the fast axis.

Single laser diode devices, which typically are used in laser printers, CDs and fiberoptics, now provide collimated emissions by using various lens arrangements in front of the laser diode. This technology is well developed and described throughout various technical journals. With ever increasing interest in very high power laser diode arrays, capable of producing multi-kilowatt peak powers, much work has been done trying to mate optics with laser diode arrays in order to provide collimated emissions. While the best answer would be to mold a lens, with the proper dimensions and curvatures, to collimate the emission, it has been difficult to produce such an optical device. While it is possible that a molded lens will be made successfully in the future, for the present individual optics appear to provide the most ready answer to collimation of emissions of laser diode arrays.

Collimation or focusing of laser diode emissions via the use of optical elements requires a very high level of mechanical precision. Not only do the optical elements need to be made to the correct dimensions, but also each of the individual lens elements then need to be located precisely with respect to the others, and more importantly to the emission area for the laser device itself. An example of the necessary accurate positioning is seen in FIG. 2, in which a laser diode bar 1 is shown with a collimating lens 2.

What is necessary to implement the FIG. 2 positioning is an appropriate lens support structure. Such a structure also could be used to enable focusing of light from laser diodes, or alternatively to limit the amount of divergence of light emitted from laser diodes.

SUMMARY OF THE INVENTION

In view of the foregoing, it is one object of the present invention to provide a precision and low cost approach to produce an optical support structure capable of meeting the mechanical precision requirements of the optical elements with respect to each other and to the array whose output is being collimated or focused.

The inventive structure is inexpensive, easily produced, and easily modified to meet the varied requirements of the end user.

To achieve the foregoing and other objects, the inventive lens support structure provides the necessary mechanical precision, support, and modifiability. While the basic concept is the same throughout the description to follow, there are several preferred embodiments and methods of fabrication. The first, simplest embodiment involves the forming of grooves in a base substrate material. Each groove is formed so as to allow precise location and support of an associated lens, thus allowing collimation of the light emission in either the fast axis or the slow axis or both, depending on the lens positioning. The lens are held in place and supported by either simple interference or a mechanical bond.

In a second embodiment, the lens support structure itself is a part of the optical system. For example, the grooves can be formed directly in an active optical element, such as a lens or other transparent element having a curved surface. Alternatively, the grooves can be formed in a passive optical element, such as a microscope slide. Smaller optical elements then could be located with great precision, thus making it possible to form very complex lens elements comprised of relatively simple and less expensive optical elements.

The grooves may be formed so as to extend partially through the base substrate material, or alternatively may extend all the way through the material, as slots. In the latter case, the lenses may be supported on support rails formed as part of the base substrate at opposite ends of the support structure. Alternatively, a largely hollow polygonal (preferably rectangular) frame structure may be formed, with grooves formed in one or more pairs of opposed sides, the lenses being fitted into the grooves.

In accordance with another embodiment, the lens support structure is very similar to that of the first two embodiments, except that the pitch, while still precisely maintained, is varied from the pitch at which the laser diodes are positioned. One result of this variation is focusing of emitted laser light, rather than just collimation. Another possible result is controlled divergence of emitted laser light. It also is possible to vary the pitch of the grooves or slots across the base, so as to provide varying levels of focusing, collimation, or divergence as desired.

BRIEF DESCRIPTION OF THE DRAWINGS

The foregoing and other objects and features of the invention will be understood from the following detailed description taken in conjunction with the accompanying drawings, in which:

FIG. 6 is a drawing of the lens support structure of FIG. 4, with lenses installed, and a typical optical path through the device for dual axis collimation;

FIG. 7 is a drawing of a lens in lens support structure constituted by an optical element, in accordance with yet another embodiment of the invention;

FIGS. 12A–12C are different views of a further lens support structure in accordance with a further embodiment of the invention.

DETAILED DESCRIPTION OF THE PREFERRED EMBODIMENTS

Figure 1:
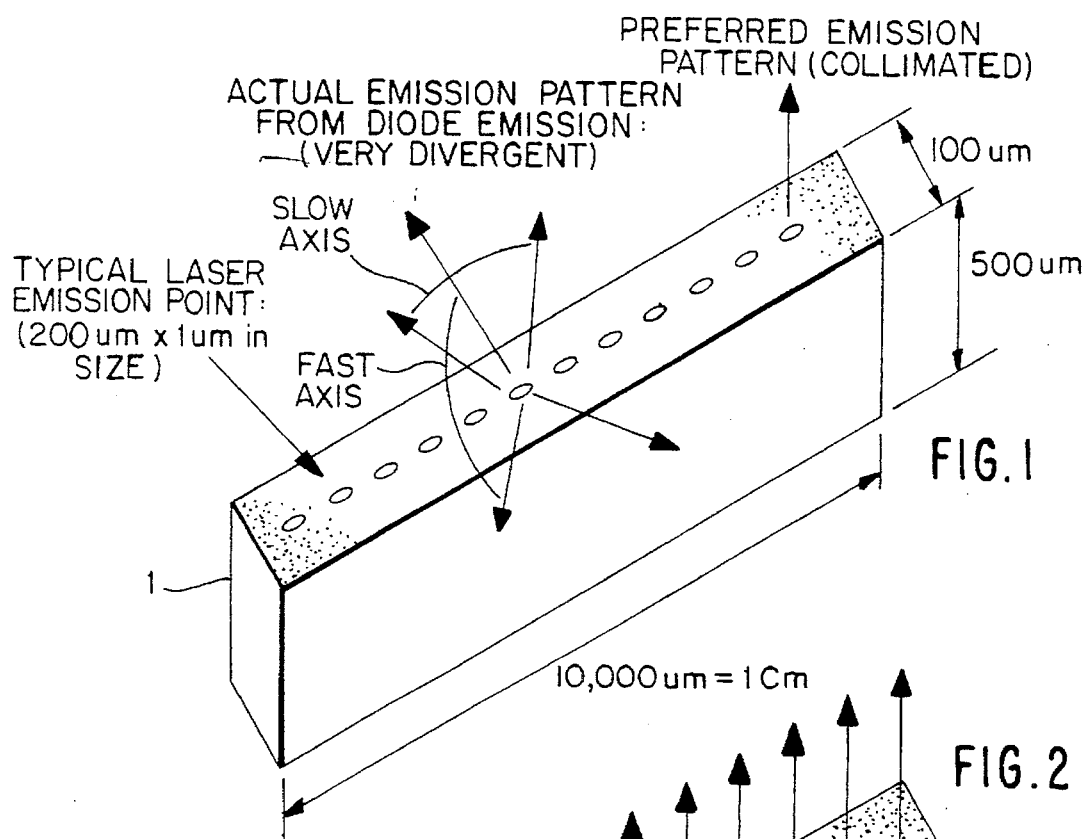
FIG. 1 is a drawing of a typical industry standard laser diode emitter, showing the divergence of the light from the device in both the fast and slow axes.
Figure 2:
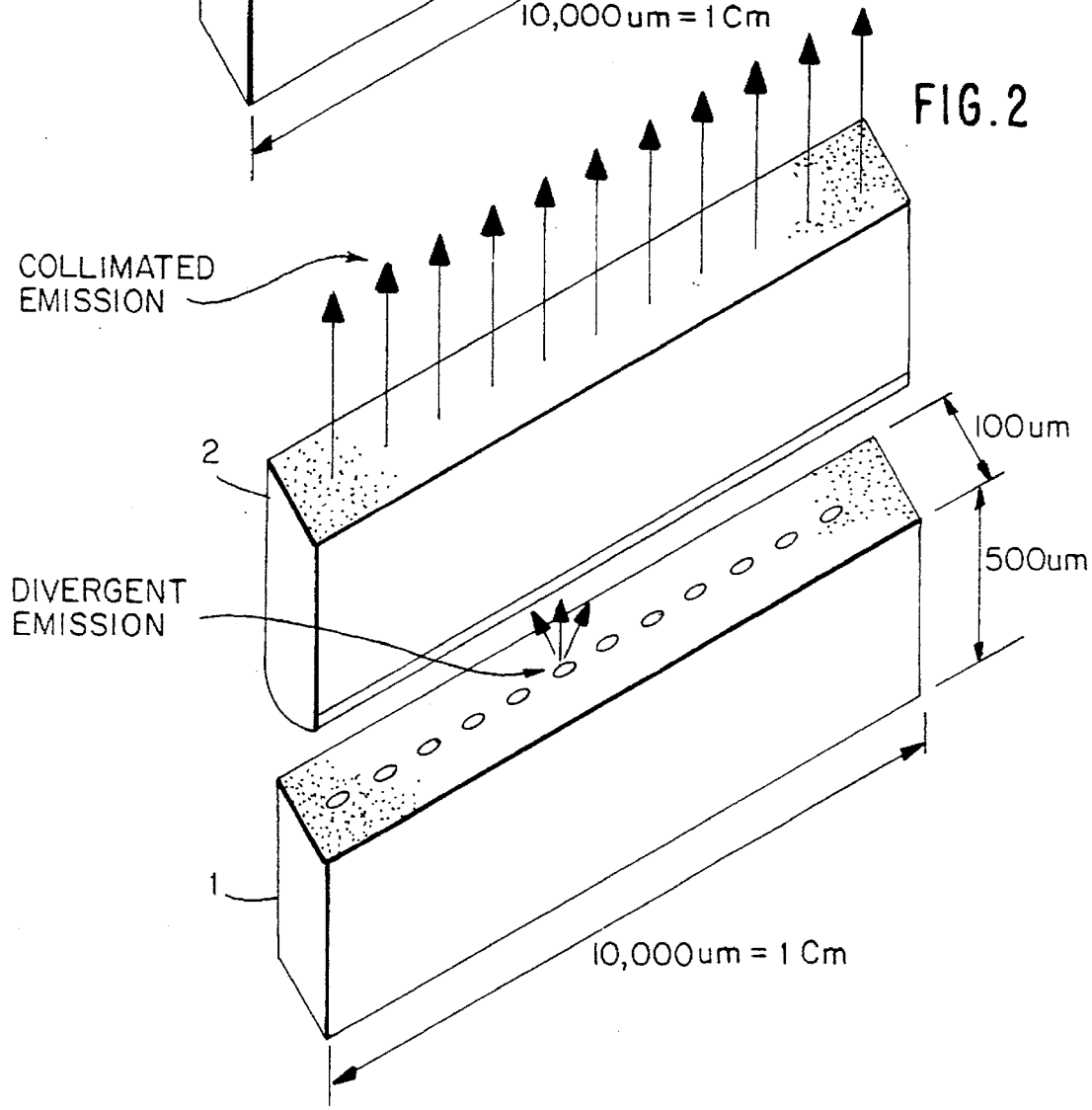
FIG. 2 is a drawing of a typical industry standard laser diode emitter, showing a typical lens located for efficient direction of the emission of the device.
Figure 3:
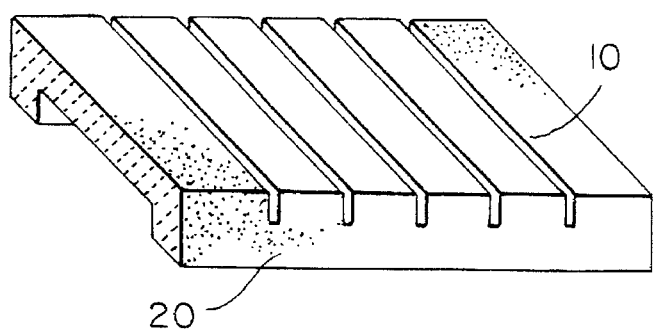
FIG. 3 is a drawing of a lens support structure for direction of a single axis of the laser device emission, in accordance with one embodiment of the invention.
Figure 4:
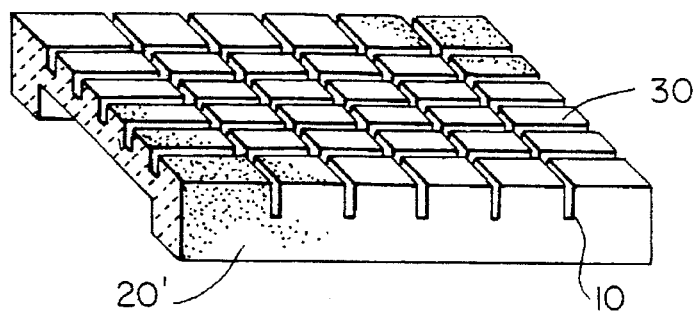
FIG. 4 is a drawing of a lens support structure for direction of both axes of the laser device emission, in accordance with another embodiment of the invention.

Referring to FIG. 3, grooves 10 are formed in a base material 20, which may be of the same material as that in which a laser diode array is formed, i.e. silicon, beryllium oxide, ceramic, or industrial diamond (see the above-referenced U.S. patents). The grooves are formed to have a length, width, and depth to support and locate an optical element (such as a lens or a microlens) precisely with respect to associated laser diode emitters (not shown in this Figure). FIG. 3 shows the grooves being formed in one axis; FIG. 4 shows base material 20' with grooves 10, 30, the grooves 30 being formed orthogonally to the grooves 10 to provide a two-dimensional lens support structure. The two-dimensional structure enables direction or collimation of light emitted by laser diode bars in both the fast and the slow axes.

Figure 5:
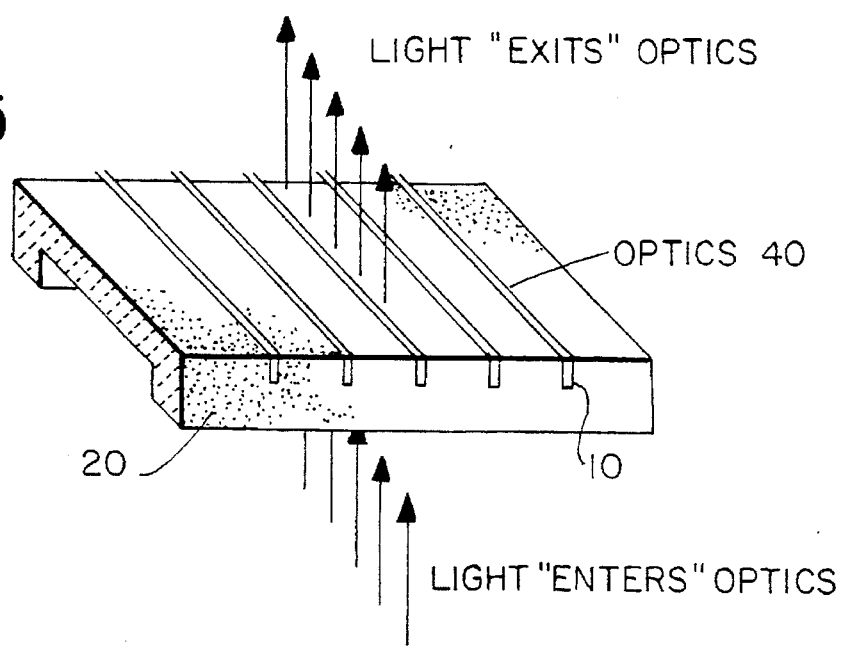
FIG. 5 is a drawing of the lens support structure of FIG. 3, with lenses installed, and a typical optical path through the device for single axis collimation.

FIG. 5 shows the base material 20 with its grooves 10 filled with optical elements 40, such as lenses or microlenses, which direct the emission from laser diode emitters (not shown), the laser diode emitters being formed in a respective substrate (also not shown). In accordance with this embodiment, the grooves 10 in base material 20 are formed at the same pitch as the grooves containing the laser diode emitters, in order to ensure collimation of the laser diode emission. This embodiment can be relatively simple to form, because the grooves can be formed using the same setup as for forming grooves in material in which the laser diodes themselves are placed, such as cutting, grinding, etching, electric discharge machining (EDM), etc. Forming the grooves and then locating the optical elements in the grooves assures the precision necessary. As shown in FIG. 5, the laser light from the laser diode array enters the optics from a bottom surface of the base material 20, and exits through the upper surface.

As was the case with FIGS. 3 and 4, while FIG. 5 shows the grooves 10 being formed in one axis in base material 20, FIG. 6 shows grooves 10, 30, formed orthogonally with respect to each other, and optical elements 40 disposed in those grooves to provide a two-dimensional lens support structure.

Referring now to FIG. 7, since the collimation of the laser diode emission can in some circumstances be followed by additional optical elements, it is possible to simplify the structure so as to allow the required collimating optical elements to be located in an active or passive optical element in the required optical train. Thus, as shown in FIG. 7, in accordance with another embodiment of the invention, grooves are formed in an active or passive optical element 50. One example of an active optical element (which would exert some optical effect on the light being passed through it) would be a lens having at least one curved surface, as shown in the Figure. An example of a passive optical element (which would simply allow light to pass through it without alteration, beyond for example the effect caused by the index of refraction of the element) would be a microscope slide.

The grooves are formed in the active or passive optical element so as to allow further optical elements to be mounted precisely in the grooves. The optical elements are held in place by interference or by standard optical bonding/mounting methodologies.

Figure 8A:
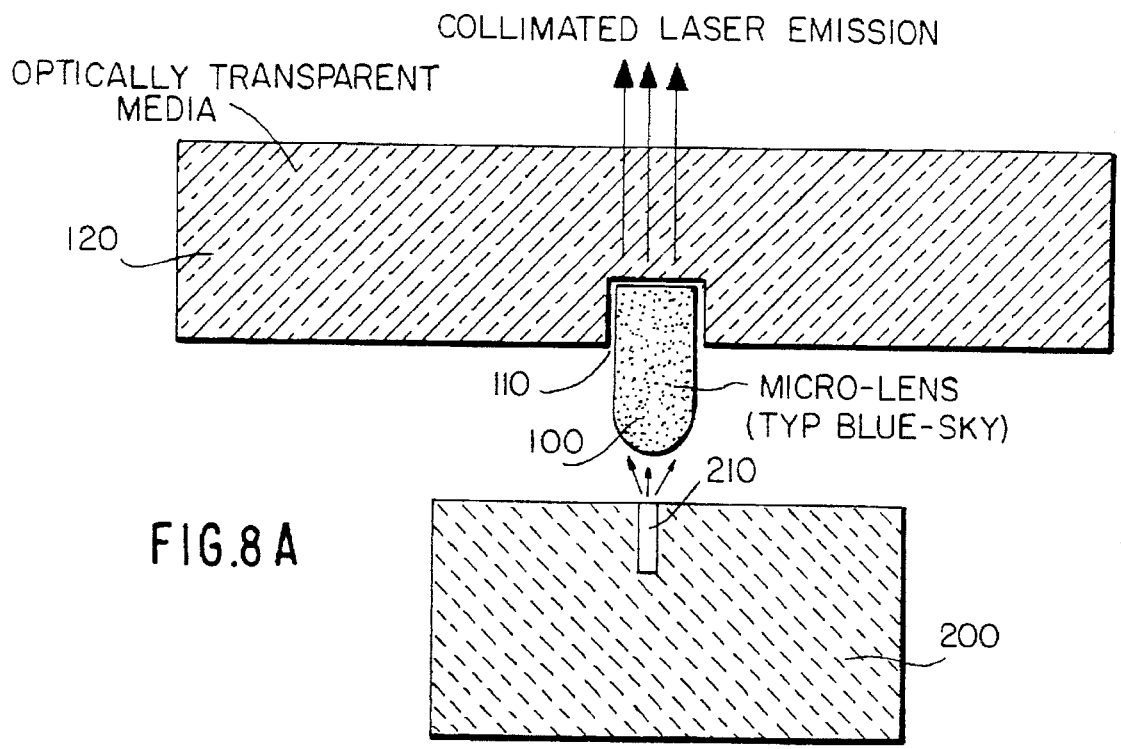
FIGS. 8A–8E show several different shapes of microlenses, inserted into grooves of varying depths, in relation to a laser bar mount containing one or more laser diode bars in confronting relation thereto.

FIG. 8A shows one example of a lens 100 mounted in a groove 110 in an optically transparent base 120. As described earlier, the groove 110 is formed in the base 120 so that, when the lens 100 is mounted therein, it confronts a laser bar mount 200, which contains one or more laser diode bars 210 inserted therein. Light emitted from the laser diode bars 210 is collimated by the lens 100, and exits through a surface of the base 120 opposite to that in which the groove 110 is formed. Details of the mount 200 are provided in the above-referenced U.S. patents.

Figure 8B:
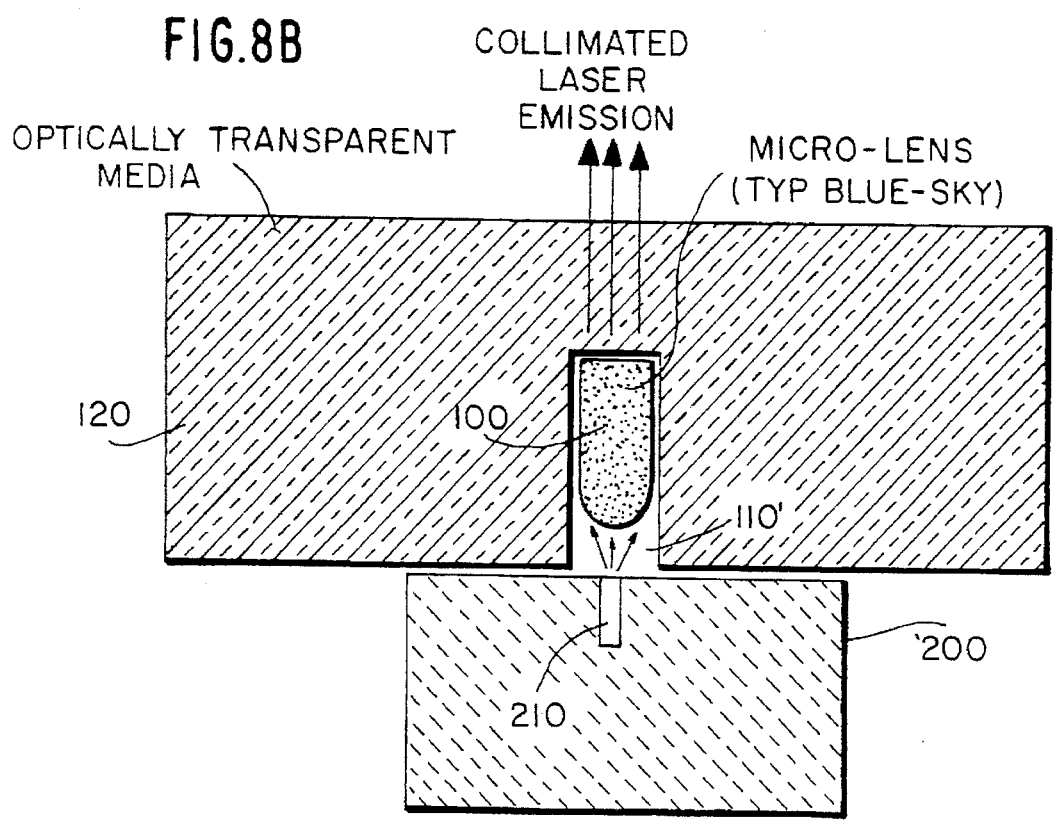
Figure 8C:
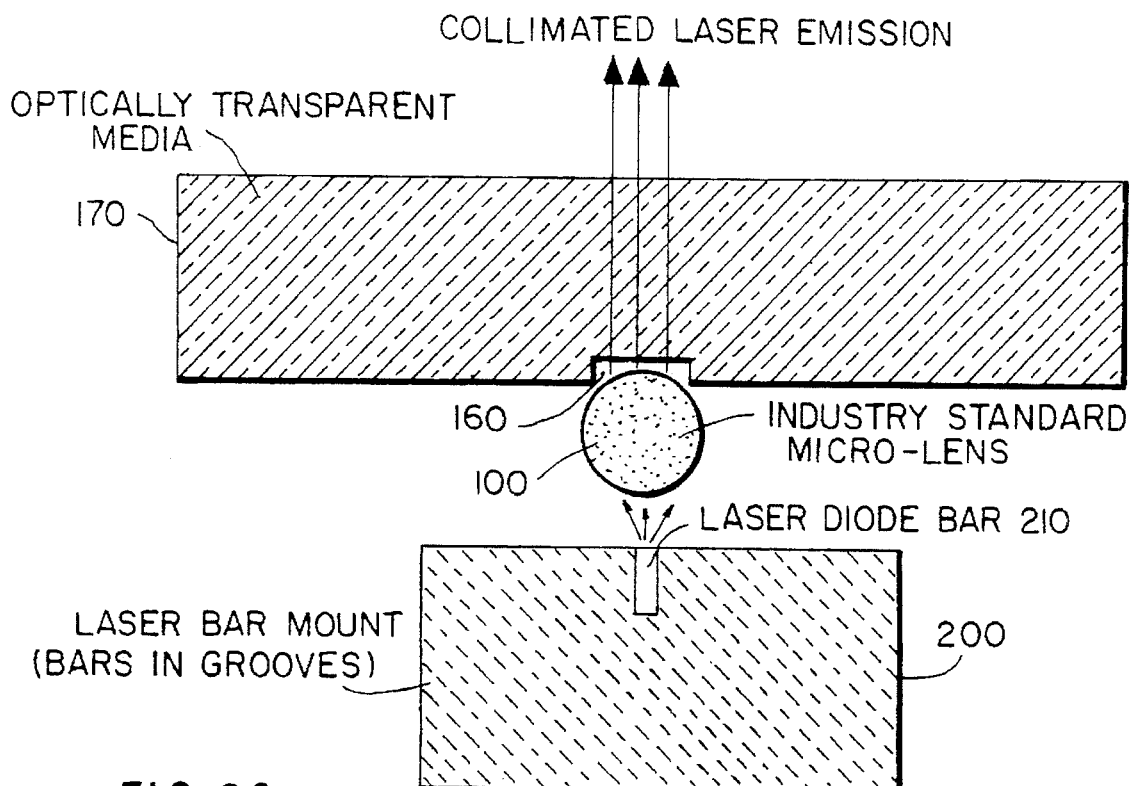
Figure 8D:
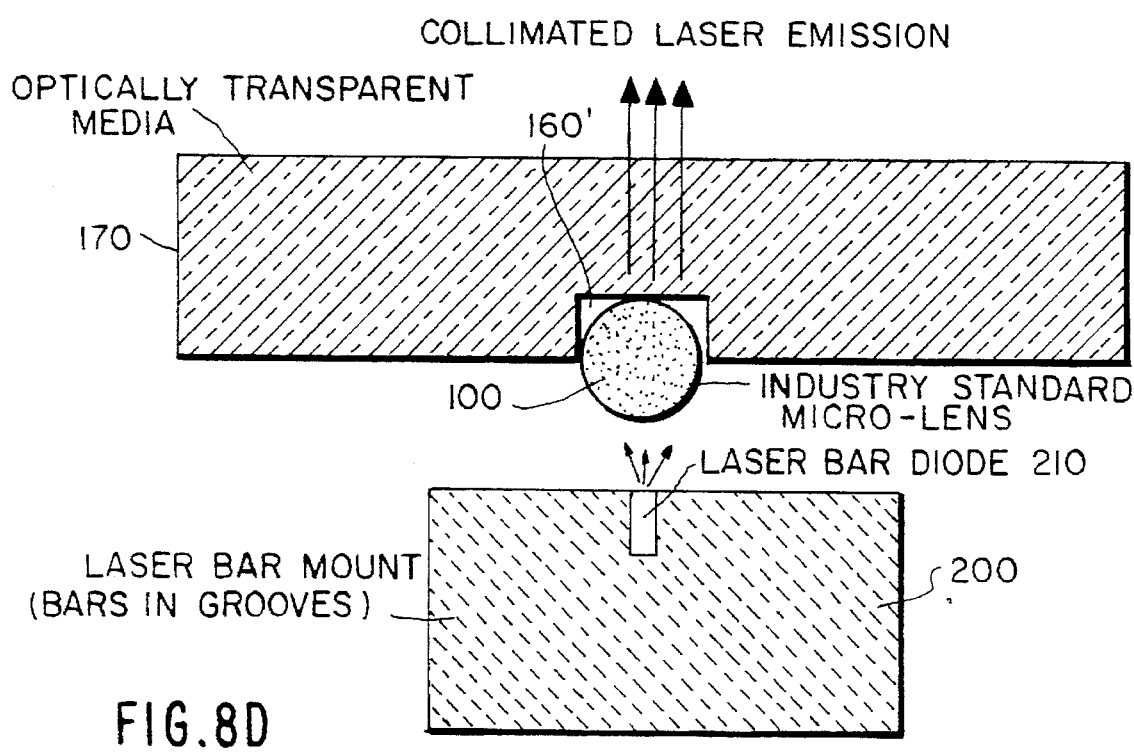
Figure 8E:
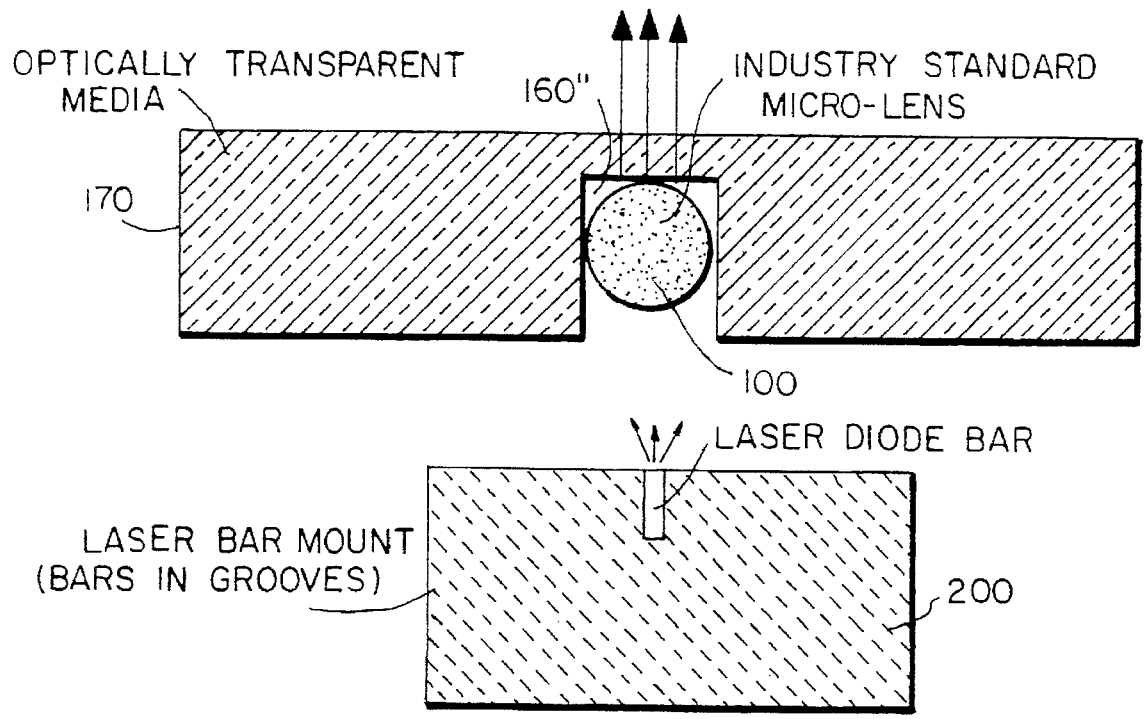

While FIG. 8A shows the groove 110 formed to be relatively shallow, so that the lens 100 protrudes from the groove, in FIG. 8B the lens 100 fits entirely within the groove 110'. FIGS. 8C–8E show a differently-shaped lens 150 formed in respective grooves 160, 160', and 160" which are of varying depths. Again, the grooves are formed in optically transparent bases 170 so as to confront the laser diode bars 210 within mount 200.

Figure 9A:
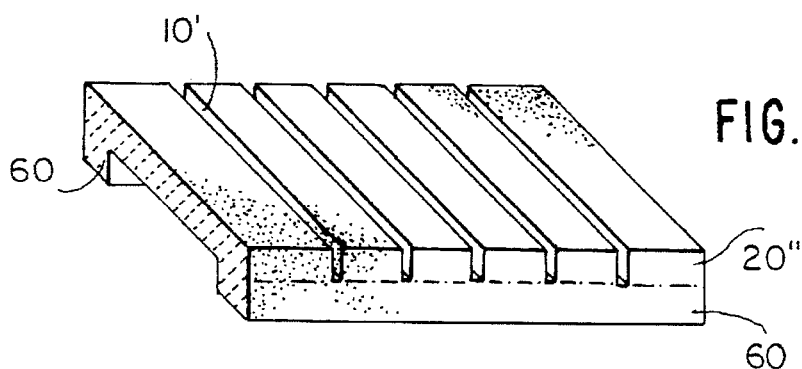
FIG. 9A and 9B are drawings of a lens support structure in accordance with yet another embodiment of the invention.
Figure 9B:
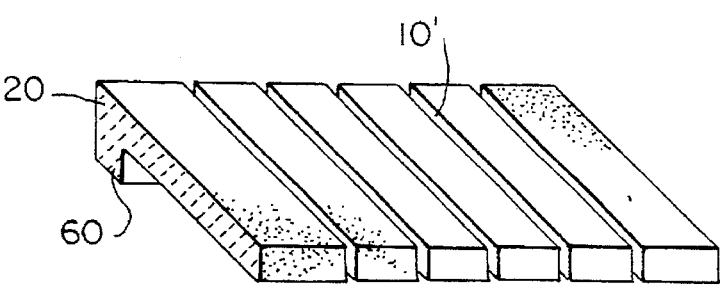

In FIGS. 3–7, the grooves 10 are shown as extending partially through the substrates 20, 20', and 50. In FIGS. 8A–8E, the grooves 110, 110', 160, 160' and 160" also are shown as extending partially through the respective substrates. However, the grooves also may be formed as slots which extend completely through the substrate, as shown in FIGS. 9A and 9B. Naturally, where the substrate is opaque, the grooves (slots) will of necessity extend completely through the substrate. In FIG. 9A, a substrate 20" has slots 10'. The substrate material is machined, ground, etched, or otherwise fabricated so that at opposite ends of the substrate 20", support rails 60 are provided on the underside of the substrate 20". The support rails 60 are shown as a separate element for the sake of clarity; however, in accordance with a preferred embodiment, the rails 60 will be made of the same material as the substrate 20", and in fact will be machined out of the same piece of material as the substrate 20" so that the overall lens support structure is unitary.

The support rails 60 perform two functions. One function is to hold the lenses in the slots 10'. The other is to provide a unitary structure; obviously, in the absence of the support rails, the structure would not be unitary.

FIG. 9A shows the support rails at opposite ends of the substrate 20". FIG. 9B is a cross-section taken through the substrate 20", past the point where one of the support rails 60 would be provided, so that it can be seen that the slots 10' extend all the way through the substrate 20".

Figure 10:
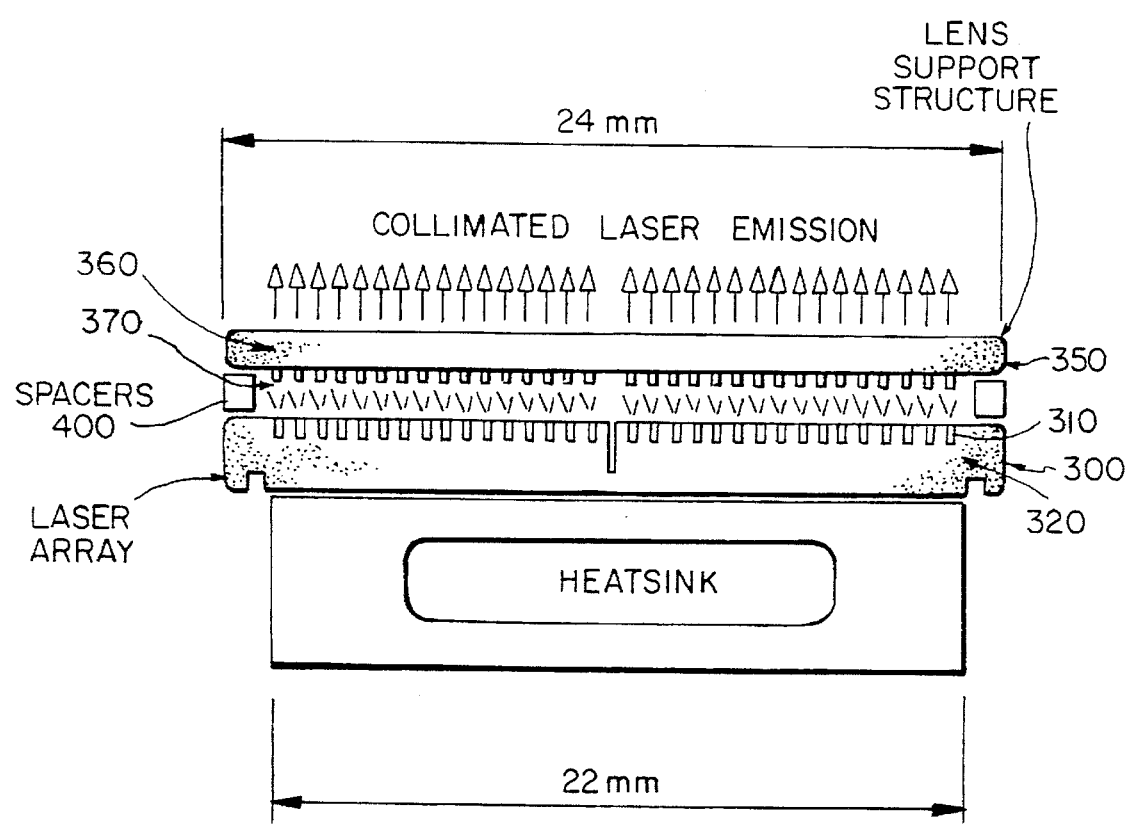
FIG. 10 shows one embodiment of an overall assembly of a laser diode array/optical element structure in accordance with the invention.

FIG. 10 shows an overall structure in which a laser array mount 300 containing a plurality of grooves 310, each containing one or more laser diode bars 320, is disposed in confronting relation to a base 350 containing further grooves 360, provided in relation to the grooves 310, and containing a plurality of microlenses 370. Spacers 400 are provided between the mount 300 and base 350. As can be seen from the Figure, laser light emitted from the laser diode bars 320 is directed by respective microlenses 370, and exits through a surface of base 350 opposite that in which grooves 360 are formed. Again, details concerning the mount 300 may be found in the above-mentioned U.S. patents.

Figure 11:
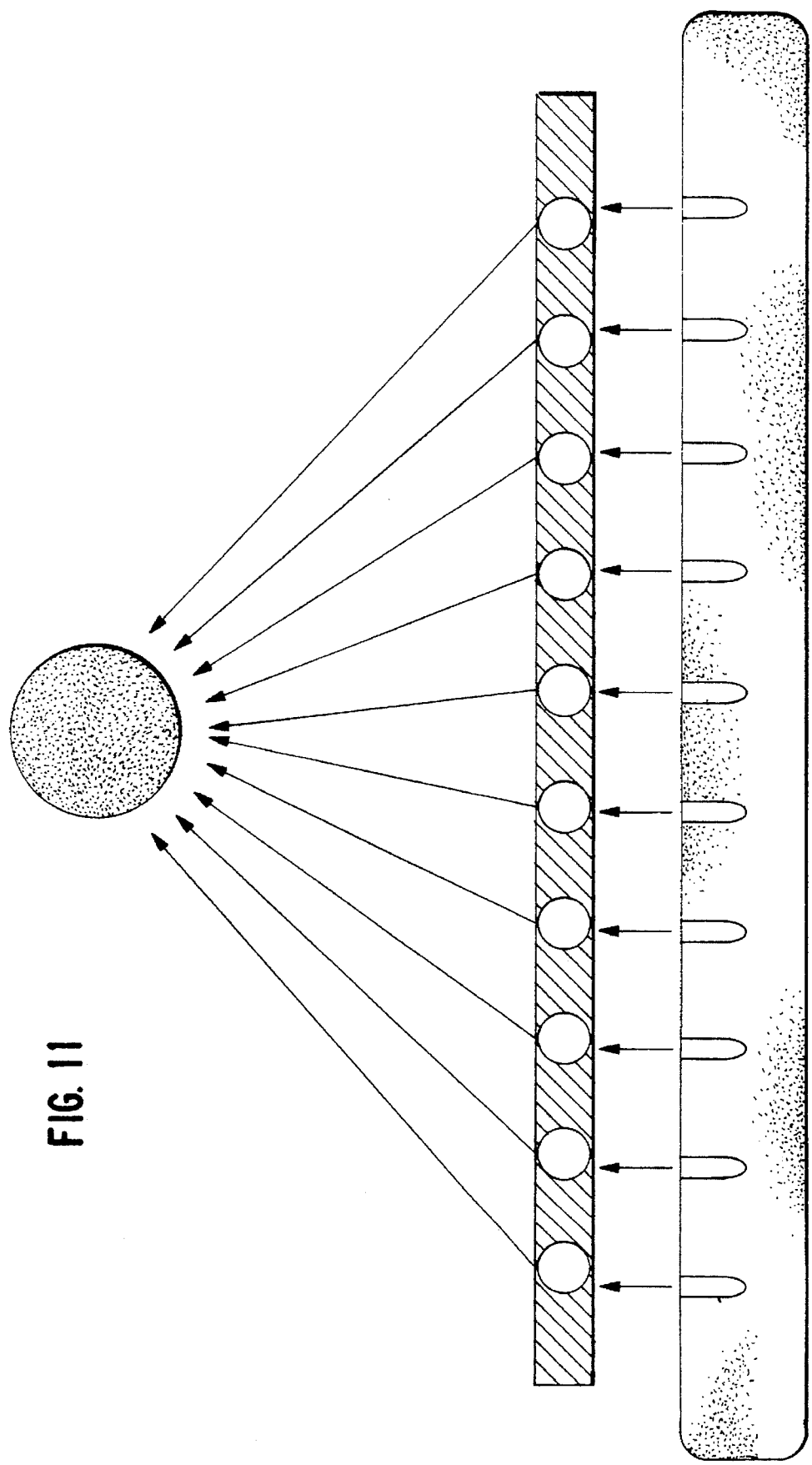
FIG. 11 shows a lens support structure in accordance with yet another embodiment of the invention.

In accordance with the embodiments described thus far, the pitch of the grooves containing the lenses is made to be the same as the pitch of the grooves containing the laser diode bars. Such precision assures collimation in the usual sense, i.e. transmission of light as parallel rays. However, it has been discovered that, by varying the pitch of the lenses in the lens support structure slightly with respect to the pitch of laser diodes in the laser diode array, it is possible to attain an enhanced focusing effect. An example of a structure employing a variation of pitch is shown in FIG. 11. The variation in pitch is apparent because, while there are as many grooves for lenses as there are for laser diode bars, the lenses are slightly closer together than are the laser diode bars.

An example of a difference in spacing would be one in which, assuming the pitch of the laser diode bars in the laser diode array is x, the pitch of the lenses in the lens support structure is 0.999x. Another example of a difference in spacing of the grooves or slots would be one in which, assuming again that the pitch of the laser diode bars in the laser diode array is x, the pitch of the lenses in the lens support structure is 1.001x.

While the two examples just described assume a constant pitch, such is not necessarily the case. For example, the pitch of the lenses could be varied selectively within a range surrounding the pitch of the laser diode bars, so as to provide desired variations in collimation, focusing, and limitation of divergence of light emission along one or more of the fast or slow axes. The range of variation may be predetermined, and may be programmed into an appropriate numerical control device which performs the actual cutting of the grooves or slots. For example, for a pitch of laser diode bars of x, the range could be 0.995x–1.005x. The range could be wider or narrower, as desired.

Also, as described above, the lens support structure is shown as a structure having a plurality of rows, with support rails holding those rows together. However, it is within the contemplation of the invention to provide a polygonal structure which basically has the shape of a frame, and in which one pair of opposed sides of the polygonal structure have indentations formed at the desired pitch of the lenses. The lenses seat nicely in their respective indentations. An example is shown in FIGS. 12A–12C, in which a lens support structure 120 has one pair of opposed sides 130 and a second pair of opposed sides 140. Indentations 145 are formed in the opposed sides 140. FIG. 12A shows a plan view of the structure 120. FIG. 12B shows a side view of the structure in which one of the opposed sides 130 can be seen. FIG. 12C shows another side view of the structure in which one of the opposed sides 140, with indentations 145, can be seen.

It is possible to provide the same types of variations in pitch of the grooves in the frame embodiment for the lens support structure as were described with respect the previous embodiments.

While the invention has been described in detail with reference to preferred embodiments, various changes and modifications within the scope and spirit of the invention will be apparent to those of working skill in this technological field. Thus, the invention is to be considered as limited only by the scope of the appended claims.

What is claimed is:

1. A lens support structure for use with a laser diode array having a plurality of laser diodes disposed in said array at a first predetermined pitch with respect to each other, said lens support structure comprising:

a base having first and second major surfaces, a plurality of grooves being formed in one of said first major surface or said second major surface at a second predetermined pitch, different from said first predetermined pitch; and a plurality of optical elements disposed in said grooves so as to allow optical radiation to pass through the optical elements;

wherein said base is adjustable relative to said laser diode array so as to align said optical elements with said laser diodes to provide desired optical transmission.

2. A lens support structure as claimed in claim 1, wherein said second predetermined pitch is less than said first predetermined pitch.

3. A lens support structure as claimed in claim 1, wherein said second predetermined pitch is greater than said first predetermined pitch.

4. A lens support structure as claimed in claim 1, wherein said plurality of grooves are a first plurality of grooves formed in said base along a first axis and said plurality of optical elements are a first plurality of optical elements, a second plurality of grooves being formed in said base at said second predetermined pitch along a second axis, orthogonal to said first axis, said structure further comprising a further plurality of optical elements disposed in said second plurality of grooves to provide collimation of light emitted by said laser diodes in addition to collimation provided by said first plurality of optical elements.

5. A laser diode device comprising:
   a laser diode array comprising a plurality of laser diodes disposed at a first predetermined pitch with respect to each other;
   said laser diode device further comprising:
      a lens support structure comprising:
         a base having first and second major surfaces, a plurality of grooves being formed at a second predetermined pitch, different from said first predetermined pitch, in one of said first major surface or said second major surface; and
         a plurality of optical elements disposed in said grooves so as to allow optical radiation to pass through the optical elements;
   said laser diode device further comprising means for adjusting said laser diode array and said base with respect to each other so as to align said optical elements with said laser diodes to provide desired optical transmission.

6. A laser diode device as claimed in claim 5, wherein said second predetermined pitch is less than said first predetermined pitch.

7. A laser diode device as claimed in claim 5, wherein said second predetermined pitch is greater than said first predetermined pitch.

8. A laser diode device as claimed in claim 5, wherein said plurality of grooves are a first plurality of grooves formed in said base along a first axis and said plurality of optical elements are a first plurality of optical elements, a second plurality of grooves being formed in said base at said second predetermined pitch along a second axis, orthogonal to said first axis, said lens support structure further comprising a further plurality of optical elements disposed in said second plurality of grooves to provide collimation of light emitted by said laser diodes in addition to collimation provided by said first plurality of optical elements.

9. A lens support structure as claimed in claim 1, wherein said grooves are slots formed in said first surface so as to extend from said first major surface through said second major surface.

10. A lens support structure as claimed in claim 9, wherein said second predetermined pitch is less than said first predetermined pitch.

11. A lens support structure as claimed in claim 9, wherein said second predetermined pitch is greater than said first predetermined pitch.

12. A lens support structure as claimed in claim 9, further comprising a first support rail disposed at a nonzero angle with respect to said plurality of slots.

13. A lens support structure as claimed in claim 12, wherein said first support rail is formed unitarily with said base.

14. A lens support structure as claimed in claim 12, further comprising a second support rail, said first and second support rails being disposed at opposite ends of said base, orthogonally to said plurality of slots.

15. A laser diode device as claimed in claim 5, wherein said grooves are slots formed in said first major surface so as to extend from said first major surface through said second major surface.

16. A lens support structure as claimed in claim 15, wherein said second predetermined pitch is less than said first predetermined pitch.

17. A lens support structure as claimed in claim 15, wherein said second predetermined pitch is greater than said first predetermined pitch.

18. A laser diode device as claimed in claim 15, further comprising a first support rail disposed at a nonzero angle with respect to said plurality of slots.

19. A laser diode device as claimed in claim 18, wherein said first support rail is formed unitarily with said base.

20. A laser diode device as claimed in claim 18, further comprising a second support rail, said first and second support rails being disposed at opposite ends of said base, orthogonally to said plurality of slots.

21. A lens support structure for use with a laser diode array having a plurality of laser diodes disposed in said array at a first predetermined pitch with respect to each other, said lens support structure comprising:
   a frame having first and second pairs of opposed sides, a first plurality of grooves being formed in each of said first pair of opposed sides at a second predetermined pitch; and
   a first plurality of optical elements disposed in said grooves so as to allow optical radiation to pass through the optical elements;
   wherein said base is adjustable relative to said laser diode array so as to align said optical elements with said laser diodes.

22. A laser diode device as claimed in claim 21, wherein alignment of said optical elements with said laser diodes assists in focusing of light emitted by said laser diode array.

23. A lens support structure as claimed in claim 21, wherein said first predetermined pitch is equal to said second predetermined pitch.

24. A lens support structure as claimed in claim 21, wherein said first predetermined pitch is less than said second predetermined pitch.

25. A lens support structure as claimed in claim 21, wherein said first predetermined pitch is greater than said second predetermined pitch.

26. A lens support structure as claimed in claim 21, wherein said second pair of opposed sides have a second plurality of grooves formed therein at a third predetermined pitch along a second axis which is orthogonal to a first axis along which said first plurality of grooves are formed, said lens support structure further comprising a second plurality of optical elements disposed in said second plurality of grooves to provide focusing of light emitted by said laser diodes in addition to focusing provided by said first plurality of optical elements.

27. A laser diode device comprising:
   a laser diode array comprising a plurality of laser diodes disposed at a first predetermined pitch with respect to each other; and
   a lens support structure comprising:
      a frame having first and second pairs of opposed sides, a plurality of grooves being formed at a second predetermined pitch in said first opposed sides; and
      a plurality of optical elements disposed in said grooves so as to allow optical radiation to pass through the optical elements;
   said laser diode device further comprising means for adjusting said laser diode array and said base with respect to each other so as to align said optical elements with said laser diodes to provide desired optical transmission.

28. A laser diode device as claimed in claim 27, wherein alignment of said optical elements with said laser diodes assists in focusing of light emitted by said laser diode array.

29. A laser diode device as claimed in claim 27, wherein said first predetermined pitch is equal to said second predetermined pitch.

30. A laser diode device as claimed in claim 27, wherein said first predetermined pitch is less than said second predetermined pitch.

31. A laser diode device as claimed in claim 27, wherein said first predetermined pitch is greater than said second predetermined pitch.

32. A lens support structure as claimed in claim 27, wherein a second plurality of grooves are formed in said second pair of opposed sides along a second axis, orthogonal to said first axis, at a third predetermined pitch, said structure further comprising a further plurality of optical elements disposed in said second plurality of grooves to provide focusing of light emitted by said laser diodes in addition to focusing provided by said first plurality of optical elements.

33. A lens support structure for use with a laser diode array having a plurality of laser diodes disposed in said array at a first predetermined pitch with respect to each other, said lens support structure comprising:
 a base having first and second major surfaces, a plurality of grooves being formed in one of said first major surface or said second major surface, a distance between adjacent ones of said grooves being one of a predetermined number of distances; and
 a plurality of optical elements disposed in said grooves so as to allow optical radiation to pass through the optical elements;
 wherein said base is adjustable relative to said laser diode array so as to align said optical elements with said laser diodes to provide desired optical transmission.

34. A lens support structure as claimed in claim 33, wherein, for any three of said grooves, distances between any two of said grooves are selectable from said predetermined number of distances.

35. A lens support structure as claimed in claim 34, wherein said grooves are slots formed in said first surface so as to extend from said first major surface through said second major surface.

36. A lens support structure as claimed in claim 35, wherein, for any three of said slots, distances between any two of said slots are selectable from said predetermined number of distances.

37. A laser diode device comprising:
 a laser diode array comprising a plurality of laser diodes disposed at a first predetermined pitch with respect to each other;
 said laser diode device further comprising:
  a lens support structure comprising:
   a base having first and second major surfaces, a plurality of grooves being formed in one of said first major surface or said second major surface, a distance between adjacent ones of said grooves being one of a predetermined number of distances; and
   a plurality of optical elements disposed in said grooves so as to allow optical radiation to pass through the optical elements;
  said laser diode device further comprising means for adjusting said laser diode array and said base with respect to each other so as to align said optical elements with said laser diodes to provide desired optical transmission.

38. A lens support structure as claimed in claim 37, wherein, for any three of said grooves, distances between any two of said grooves are selectable from said predetermined number of distances.

39. A lens support structure as claimed in claim 37, wherein said grooves are slots formed in said first surface so as to extend from said first major surface through said second major surface.

40. A lens support structure as claimed in claim 39, wherein, for any three of said slots, distances between any two of said slots are selectable from said predetermined number of distances.

41. A lens support structure for use with a laser diode array having a plurality of laser diodes disposed in said array at a first predetermined pitch with respect to each other, said lens support structure comprising:
 a frame having first and second pairs of opposed sides, a first plurality of grooves being formed in each of said first pair of opposed sides, a distance between adjacent ones of said grooves being one of a predetermined number of distances; and
 a first plurality of optical elements disposed in said grooves so as to allow optical radiation to pass through the optical elements;
 wherein said base is adjustable relative to said laser diode array so as to align said optical elements with said laser diodes to provide desired optical transmission.

42. A lens support structure as claimed in claim 41, wherein, for any three of said grooves, distances between any two of said grooves are selectable from said predetermined number of distances.

43. A laser diode device comprising:
 a laser diode array comprising a plurality of laser diodes disposed at a first predetermined pitch with respect to each other; and
 a lens support structure comprising:
  a frame having first and second pairs of opposed sides, a plurality of grooves being formed in first opposed sides, a distance between adjacent ones of said grooves being one of a predetermined number of distances; and
  a plurality of optical elements disposed in said grooves so as to allow optical radiation to pass through the optical elements;
  said laser diode device further comprising means for adjusting said laser diode array and said base with respect to each other so as to align said optical elements with said laser diodes to provide desired optical transmission.

44. A lens support structure as claimed in claim 43, wherein, for any three of said grooves, distances between any three of said grooves are selectable from said predetermined number of distances.

* * * * *